(12) United States Patent
Sato et al.

(10) Patent No.: US 6,713,210 B1
(45) Date of Patent: Mar. 30, 2004

(54) SECONDARY CELL PROTECTION CIRCUIT DEVICE AND SECONDARY CELL ASSEMBLY

(75) Inventors: Takashi Sato, Chiba (JP); Naofumi Miyasaka, Chiba (JP); Takashi Hasunuma, Narita (JP)

(73) Assignee: Tyco Electronics Raychem K.K., Kanagawa (JP)

( * ) Notice: Subject to any disclaimer, the term of this patent is extended or adjusted under 35 U.S.C. 154(b) by 0 days.

(21) Appl. No.: 09/700,692

(22) PCT Filed: May 17, 1999

(86) PCT No.: PCT/JP99/02537

§ 371 (c)(1),
(2), (4) Date: Mar. 21, 2001

(87) PCT Pub. No.: WO99/60637

PCT Pub. Date: Nov. 25, 1999

(30) Foreign Application Priority Data

May 18, 1998 (JP) .............................. 10-135694

(51) Int. Cl.[7] .......................... H01M 2/34; H01M 10/48
(52) U.S. Cl. .......................................... 429/62; 429/61
(58) Field of Search ................ 429/61, 62, 7

(56) References Cited

U.S. PATENT DOCUMENTS

| 5,545,591 A | 8/1996 | Sugai et al. ............ 429/7 |
| 5,691,688 A | * 11/1997 | West et al. |
| 6,285,005 B1 | * 9/2001 | Aakalu et al. |
| 6,322,921 B1 | * 11/2001 | Iwaizono et al. |

FOREIGN PATENT DOCUMENTS

| EP | 649562 | * 3/1998 |
| JP | 4-101373 | 9/1992 |
| JP | 7-272748 | 10/1995 |
| JP | 8-55619 | 2/1996 |
| JP | 10-12201 | 1/1998 |

* cited by examiner

Primary Examiner—John S. Maples

(57) ABSTRACT

A PTC device formed integrally on a PCB substrate, such a PCB substrate, a secondary battery protection circuit device comprising such PCB substrate provided with a circuit to control the voltage and current of secondary batteries, and a secondary battery assembly provided with said device. A PCB substrate 1 is provided with an electronic component 2 and a PTC device 3. The PTC device 3 has a construction having a PTC material 6 in the center, which is provided with foils 7, 7' made of nickel foil on its top and bottom; an outlet electrode 4 is provided on the foil 7, and an outlet electrode 5, provided on the PCB substrate, is soldered below.

14 Claims, 1 Drawing Sheet

SECONDARY CELL PROTECTION CIRCUIT DEVICE AND SECONDARY CELL ASSEMBLY

FIELD OF THE INVENTION

This invention relates to a PTC device formed integrally on a PCB substrate, such PCB substrate, a secondary battery protection circuit device wherein a secondary battery control circuit is provided on the substrate to control the temperature, voltage, and current of the secondary battery, and a secondary battery assembly provided with said device.

BACKGROUND ART

Various types of secondary batteries have in recent times been developed, such as nickel hydride batteries and lithium batteries. These are more lightweight and have a larger capacity than lead storage batteries conventionally used for electric power, and have been used in many applications. Because of their characteristics of light weight and large capacity, they have been used in electric vehicles powered by an electric motor and in hybrid vehicles, which combine an electric motor and an internal combustion engine.

Also, since the maximum voltage and current capacity in individual secondary batteries are limited by their reaction principle, a plurality of batteries are connected in series to obtain the required voltage for applications requiring a large driving force such as those described above, and the batteries are further connected in parallel to obtain the required current capacity.

When using such secondary batteries as are described above, the batteries must first be charged. Normally, the voltage required to charge the batteries is applied to the plurality of secondary batteries connected in series. However, this has a drawback as described below.

Notwithstanding the strictest quality control, it is difficult to achieve uniformity in the charge and discharge characteristics of the secondary batteries, and discrepancies in internal resistance, which change depending on the charge or discharge conditions, cannot be avoided. Thus, when a charge voltage is applied to the entirety of a plurality of secondary batteries having differing internal resistance and which are connected in series, the receiving current runs uniformly through all the batteries causing, in some cases, extreme temperature rises in secondary batteries having a high internal resistance. Not only will such temperature rises in a secondary battery shorten the life of the battery, but also in some cases the extreme temperature rise may damage the casing.

In order to eliminate such a drawback, the required voltage may be applied to both ends of each individual secondary battery while at the same time controlling overcurrents and overvoltages that may be applied to the secondary battery. Excessive temperature rises as described above must also be detected.

To achieve this, one method of detecting temperature rises is, for example, a bimetal contact method. In this method, however, if chattering occurs on the contacts through on-off switching, arc discharges may cause the contacts to stick together so that they no longer function as a switch. This method also had a problem with safety.

A method using PTC (Positive Temperature Coefficient) material having positive temperature coefficient characteristics to detect temperature in secondary batteries has also heretofore been used. When the surface temperature of the object to be measured is transmitted through contact, the PTC material shows a characteristic wherein it has a low electrical resistance at relatively low temperatures such as room temperature, but exhibits an extremely high resistance when exposed to a high temperature such as might occur when an abnormally large current flows through the object to be measured.

Specifically, control of such an overvoltage was conventionally performed by electronic components such as IC/LSIs and the like provided on a PCB substrate for that purpose, while detection of an overcurrent and an excessive temperature rise were performed by separate devices using circuits provided with PTC devices as described above.

SUMMARY OF THE INVENTION

This invention was devised in view of such circumstances and is intended to provide a PTC device formed integrally on a PCB substrate so that the electrode section on the substrate can be used as the outlet electrode, which takes up little space and which promotes efficiency by sharing part of its structure with the substrate. The invention is also intended to provide such a PCB substrate, a secondary battery protection circuit wherein current and voltage control circuits are both provided on said PCB substrate to improve the space factor of the circuit as a whole when compared with the use of discrete devices and to achieve energy savings, and a secondary battery assembly that includes this secondary battery protection circuit to allow comprehensive control of temperature, current, and voltage.

The invention is a PTC device exhibiting positive temperature coefficient behavior and having a pair of outlet electrodes formed integrally on the surface of said device, wherein at least one of said pair of outlet electrodes is an electrode section formed on a PCB substrate on which are mounted said PTC device and other electronic components such as a field effect transistor, semiconductor integrated circuit, and the like.

The invention is a PCB substrate on which is mounted a PTC device.

The invention is a secondary battery protection circuit device provided with a temperature detecting circuit for secondary batteries using the abovementioned PTC device, and a control circuit to control the current and voltage of the secondary batteries on the PCB substrate.

The invention is a secondary battery assembly provided with the secondary battery protection circuit device.

As explained above, according to this invention of a PTC device formed integrally on a PCB substrate, such a PCB substrate, a secondary battery protection circuit device comprising such PCB substrate provided with a circuit to control the voltage and current of secondary batteries, and a secondary battery assembly provided with said device, the following effects are obtained:

1. By using the electrode section of the PCB substrate as at least one of the outlet electrodes of the PTC device mounted on the PCB substrate, a space saving for the PCB substrate as a whole including the PTC device is achieved; also the manufacturing efficiency of the PCB substrate as a whole is improved and a high reliability is obtained.
2. Having a combination of PTC device and voltage/current control circuit on a single PCB substrate allows the temperature, voltage, and current of a secondary battery to be integrally controlled to protect the secondary battery.
3. By providing, together with the secondary battery, a secondary battery protection circuit device mounted on the above PCB substrate according to the invention, the volume of the secondary battery assembly is decreased, a cost reduction is achieved, and the reliability of temperature, voltage, and current control is improved.

DETAILED DESCRIPTION OF THE INVENTION

Figure 1:
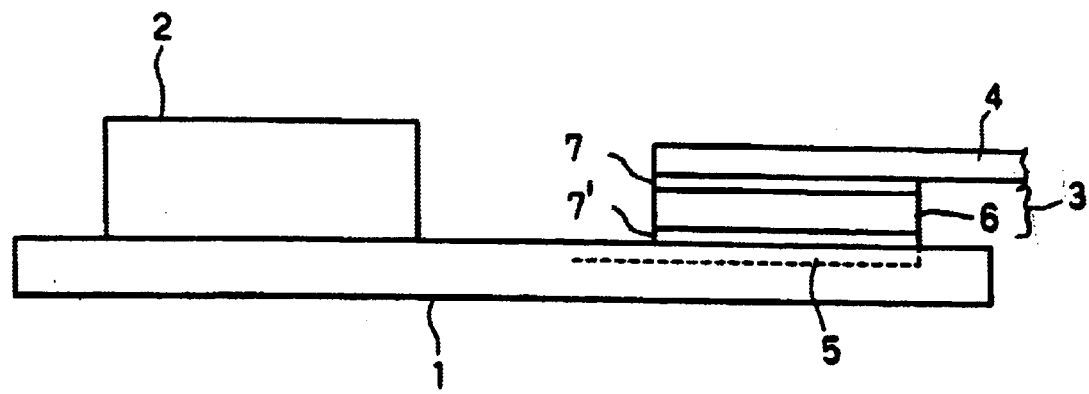
FIG. 1 is a cross-sectional view of an embodiment of a PTC device and a PCB substrate according to the invention.

An embodiment of a PTC device according to the invention is explained below referencing FIG. 1. FIG. 1 is a cross-sectional example of a PTC device and a PCB substrate on which the PTC device is mounted in accordance with this invention. In FIG. 1, 1 is the PCB substrate according to this invention, and 3 is the PTC device according to the invention. The PTC device 3 is constructed in the following fashion: first, there is PTC material 6 in the center, whose two opposing surfaces are provided with foils 7, 7' consisting of Ni (nickel) foil or Ni/Cu (nickel/copper) foil. These foils 7, 7' are the electrodes for the abovementioned PTC material 6. A Ni (nickel) outlet electrode 4 is soldered to the upper surface of the abovementioned foil 7.

A Cu (copper) electrode provided on the PCB substrate, to which the PTC device is mounted, is also soldered to the lower surface of the foil 7. This functions as the outlet electrode 5 for the PTC device. Thus, the device has a sandwich construction, wherein foils 7, 7' sandwich the PTC material, and these are further sandwiched by outlet electrodes 4, 5.

The above describes the construction of the PTC device 3. In addition to the abovementioned PTC device, an electronic component 2 such as an IC or an LSI and the like is mounted on the PCB substrate 1.

Although the outlet electrodes for the PTC device are normally provided on the upper surface and the lower surface respectively of the foils 7, 7', this invention uses the electrode 5 provided on the PCB substrate 1 as the outlet electrode on the lower surface. Compared with instances where a PTC device with independent outlet electrodes is mounted on a PCB substrate, the efficiency in wiring and assembly is improved, thereby achieving high reliability for the PCB substrate as a whole. Space is also saved for the PCB substrate as a whole by making the profile of the PTC device the same height as, or lower than, the electronic component 2.

Next, the operation of the PTC device is described when the PCB substrate 15 according to this embodiment is used on a secondary battery being charged or in use. Since the heat generated by the secondary battery is transmitted to the PTC device 3 on the PCB substrate 1, if the temperature of the secondary battery increases and exceeds a specific value, the electrical resistance of the device increases sharply owing to the nature of the PTC material. Thus, excessive temperature increase in the secondary battery can be detected by measuring the current flowing from the electrode 5 on the PCB substrate through the foil 7, the PTC material 6, and the foil 7 to the outlet electrode 4. As a result, necessary measures such as discontinuation of the charging process or replacing the secondary battery and the like can be taken to protect the secondary battery.

Figure 2:
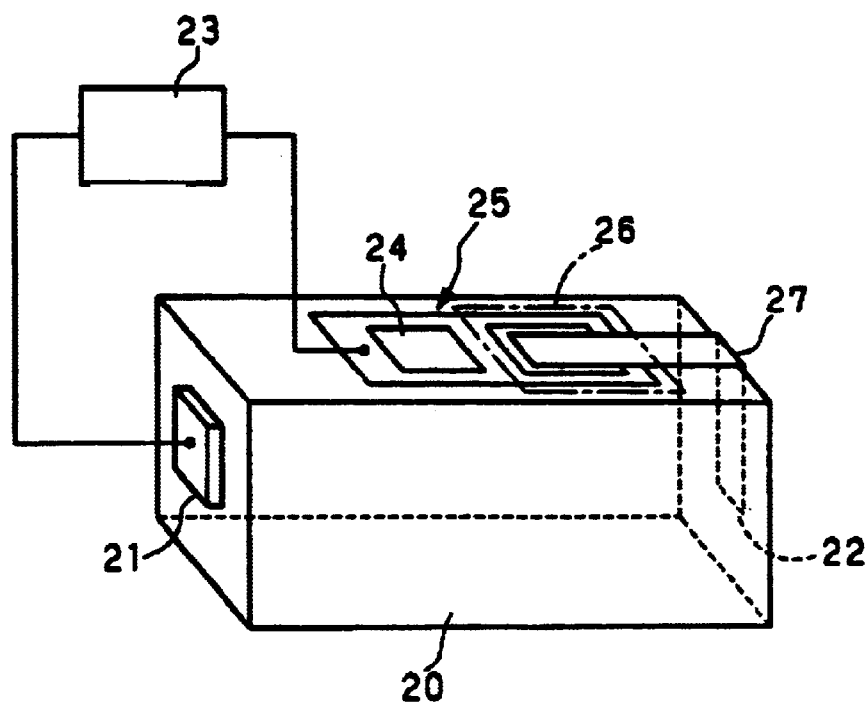
FIG. 2 is an embodiment of a secondary battery protection circuit device according to the invention.

Next, an example of a second embodiment of the secondary battery protection circuit and the secondary battery assembly provided with such a secondary battery protection circuit is explained referencing FIG. 2. The secondary battery protection circuit has a PTC device according to the foregoing first embodiment mounted on the same PCB substrate, with a voltage or current control circuit as the electronic component. The control circuit on the PCB circuit, which is provided in contact with the secondary battery, detects the voltage at which the secondary battery supplies power; as a result, current is controlled during an abnormality so that overcurrents to or overvoltages on the secondary battery, which may cause the secondary battery to be destroyed, are prevented. Further, the PTC device on the PCB substrate detects overcurrents or excessive temperature increases, thereby controlling the current and similarly protecting the secondary battery.

In FIG. 2, the PCB substrate 25 is provided on the side of and in contact with the secondary battery 20. The PCB substrate has a voltage control circuit 24 and a PTC device 26 that is enclosed by the single dotted line in the Figure. One end (on the left side in the FIG. 2) of the outlet electrode 27 of the PTC deice 26 is soldered to the PTC device 26, while the other end (on the right side in the FIG. 2) is welded to the minus electrode (negative electrode) of the secondary battery 20. The construction of the PTC device 26 is the same as the construction described in the first embodiment above; the unillustrated outlet electrode provided opposite to the abovementioned outlet electrode 27 is provided on the PCB substrate 25. An electrical circuit 23, which charges the secondary battery 20 or supplies power, is electrically connected between the plus electrode (positive electrode) 21 of the secondary battery 20 and the PCB substrate 25.

In the circuit in FIG. 2, the route through which the power of the secondary battery 20 is supplied, or the route through which the current flow when the secondary battery is being charged, is from the plus electrode of the secondary battery 20 through the electrical circuit 23 into one end of the PCB substrate 25, through the voltage circuit 24 and the PTC device 26, out of the outlet electrode 27 on the other end of the PCB substrate 25 to the minus electrode 22 positioned opposite the foregoing plus electrode 21 of the secondary battery 20, thereby forming a closed circuit for the current.

Next, the operation of this second embodiment is explained. If, when the electrical circuit 23 is connected during use or while charging, the voltage on the circuit rises above the specified value for any reason, the voltage control circuit detects the overvoltage and cuts off the current. Also, because an overcurrent flows simultaneously to the PTC device 26, heat is generated and increases temperature of the device as a result of which, owing to the nature of the PTC device, the electrical resistance increases and the current flowing to the outlet electrode 27 decreases.

Also, if an abnormality occurs on the secondary battery and its surface temperature increases excessively, the heat is transmitted to the PTC device 26 and the current through the PTC device is limited through the same principle described above. As a result, because the current flowing through the secondary battery 21 and the electrical circuit 23 also flows through the PCB substrate 25, the voltage control circuit 24 and the PTC device 26 provided thereon will monitor overvoltages and excessive temperature increases, and limit the current flowing to the minus electrode 22 during an abnormality, thereby protecting the secondary battery.

The foregoing second embodiment showed an example of a single secondary battery using one PCB substrate provided with the secondary battery protection circuit device. However, by using the foregoing PCB substrate in a suitable location under suitable conditions on a plurality of secondary batteries connected in series or in parallel, a secondary battery assembly according to this invention, provided with a plurality of secondary batteries and a secondary battery protection circuit device, may be obtained.

In this invention, the temperature, voltage, as well current of a secondary battery can be detected by both a control circuit and a PTC device being provided in combination on the same PCB substrate so that the secondary battery can be protected during use or while being charged. This also allows either the control circuit or the PTC device to detect an abnormality in the secondary battery, provide control, and protect the secondary battery even if the other is not functioning normally. The second embodiment described above, however, is an example of controlling the temperature and voltage of the secondary battery.

In the foregoing explanations on the embodiments, the application for the abovementioned PTC device and the PCB substrate on which is mounted the PTC device is to protect secondary batteries. However, the use of the invention is not necessarily limited to the protection of secondary batteries but is broadly effective in fields requiring temperature detection and in applications where voltages and currents are in addition controlled at the same time.

What is claimed is:

1. A secondary battery assembly comprising
   (1) a secondary battery, and
   (2) a secondary battery protection circuit device which comprises a PCB substrate, said PCB substrate
      (a) having mounted on it a PTC device which (i) exhibits positive temperature coefficient behavior, (ii) comprises a PTC material positioned between first and second metal foils which form surfaces of the device, and (iii) has a pair of outlet electrodes formed integrally on its surfaces, at least one of said pair of outlet electrodes being an electrode section formed on the PCB substrate on which are mounted said PTC device and an electronic component;
      (b) comprising a temperature detecting circuit for the secondary battery using the PTC device, and
      (c) comprising a control circuit to control the current and voltage of the secondary battery.

2. A secondary battery assembly according to claim 1 wherein the electronic component is a field effect transistor.

3. A secondary battery assembly according to claim 1 wherein the electronic component is a semiconductor integrated circuit.

4. A secondary battery assembly according to claim 1 wherein the first and second metal foils comprise nickel or nickel/copper.

5. A secondary battery assembly according to claim 1 wherein the electrode section formed on the PCB substrate comprises copper.

6. A secondary battery assembly according to claim 5 wherein the pair of outlet electrodes also comprises a nickel electrode.

7. A secondary battery assembly according to claim 1 which comprises a plurality of secondary batteries.

8. A secondary battery protection circuit device which comprises a PCB substrate, said PCB substrate
   (a) having mounted on it a PTC device which (i) exhibits positive temperature coefficient behavior, (ii) comprises a PTC material positioned between first and second metal foils which form surfaces of the device, and (iii) has a pair of outlet electrodes formed integrally on its surfaces, at least one of said pair of outlet electrodes being an electrode section formed on the PCB substrate on which are mounted said PTC device and an electronic component,
   (b) comprising a temperature detecting circuit for a secondary battery using the PTC device, and
   (c) comprising a control circuit to control the current and voltage of the secondary battery.

9. A secondary battery protection device according to claim 8 wherein the electronic component is a field effect transistor.

10. A secondary battery protection device according to claim 8 wherein the electronic component is a semiconductor integrated circuit.

11. A secondary battery protection device according to claim 8 wherein the first and second metal foils comprise nickel or nickel/copper.

12. A secondary battery protection device according to claim 8 wherein the electrode section formed on the PCB substrate comprises copper.

13. A secondary battery protection device according to claim 12 wherein the pair of outlet electrodes also comprises a nickel electrode.

14. A secondary battery protection device according to claim 8 wherein the PTC device has a profile having a height the same as or lower than the height of the electronic component.

* * * * *